United States Patent
Li et al.

(10) Patent No.: US 11,672,149 B2
(45) Date of Patent: Jun. 6, 2023

(54) OLED DISPLAY PANEL IN WHICH EACH DRIVE SIGNAL LINE INCLUDES FIRST SECTION OF WIRING AT ANODE LAYER AND EACH POWER SUPPLY VOLTAGE SIGNAL LINE INCLUDES SECOND SECTION WIRING AT GATE METAL LAYER, AND METHOD FOR DETECTING THE OLED DISPLAY PANEL, AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Guangyao Li, Beijing (CN); Dongfang Wang, Beijing (CN); Jun Wang, Beijing (CN); Haitao Wang, Beijing (CN); Qinghe Wang, Beijing (CN); Ning Liu, Beijing (CN); Wei Li, Beijing (CN); Yingbin Hu, Beijing (CN); Yang Zhang, Beijing (CN)

(73) Assignees: Hefei Xinsheng Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 220 days.

(21) Appl. No.: 16/910,766

(22) Filed: Jun. 24, 2020

(65) Prior Publication Data
US 2021/0036089 A1 Feb. 4, 2021

(30) Foreign Application Priority Data
Jul. 30, 2019 (CN) .......................... 201910696085.4

(51) Int. Cl.
H10K 59/131 (2023.01)
H10K 71/70 (2023.01)
(Continued)

(52) U.S. Cl.
CPC ...... *H01L 27/3276* (2013.01); *H01L 51/0031* (2013.01); *H01L 51/56* (2013.01); *H01L 2251/5392* (2013.01); *H01L 2251/568* (2013.01)

(58) Field of Classification Search
CPC . H01L 27/3276; H01L 51/0031; H01L 51/56; H01L 2251/5392; H01L 2251/568
(Continued)

(56) References Cited

U.S. PATENT DOCUMENTS

2006/0138942 A1 6/2006 Bang et al.
2007/0139311 A1* 6/2007 Cho ..................... G09G 3/3233
345/76

(Continued)

FOREIGN PATENT DOCUMENTS

CN 204216048 A 3/2015
CN 107275372 A 10/2017
(Continued)

OTHER PUBLICATIONS

Chinese Office Action for corresponding application 201910696085.4 dated Apr. 12, 2021.

*Primary Examiner* — Lex H Malsawma
*Assistant Examiner* — Eric W Jones
(74) *Attorney, Agent, or Firm* — ArentFox Schiff LLP; Michael Fainberg

(57) ABSTRACT

The present disclosure provides an OLED display panel and a method for detecting the OLED display panel, and a display device. The OLED display panel includes a base substrate including a display area and a non-display area
(Continued)

surrounding the display area and having a first region adjacent to the display area. The display area includes a drive signal line and a power supply voltage signal line both extending from the display area to the first region. The drive signal line includes, in the first region, a first section of wiring at an anode layer, the power supply voltage signal line includes, in the first region, a second section of wiring at a gate metal layer, and parts of the drive signal line and the power supply voltage signal line in the display area are located at a source-drain metal layer.

10 Claims, 2 Drawing Sheets

(51) Int. Cl.
*H10K 71/00* (2023.01)
*H10K 102/00* (2023.01)
*H01L 27/32* (2006.01)
*H01L 51/00* (2006.01)
*H01L 51/56* (2006.01)

(58) Field of Classification Search
USPC .................................................. 257/40, 59
See application file for complete search history.

(56) References Cited

U.S. PATENT DOCUMENTS

| | | | |
|---|---|---|---|
| 2008/0204618 A1* | 8/2008 | Jung | ................... G02F 1/13452 349/40 |
| 2017/0125505 A1* | 5/2017 | Oh | ....................... H01L 27/3276 |
| 2018/0203315 A1* | 7/2018 | Wang | ................ G02F 1/136286 |
| 2019/0221584 A1 | 7/2019 | Kang et al. | |

FOREIGN PATENT DOCUMENTS

| | | |
|---|---|---|
| CN | 108169972 A | 6/2018 |
| CN | 110047847 A | 7/2019 |

* cited by examiner

OLED DISPLAY PANEL IN WHICH EACH DRIVE SIGNAL LINE INCLUDES FIRST SECTION OF WIRING AT ANODE LAYER AND EACH POWER SUPPLY VOLTAGE SIGNAL LINE INCLUDES SECOND SECTION WIRING AT GATE METAL LAYER, AND METHOD FOR DETECTING THE OLED DISPLAY PANEL, AND DISPLAY DEVICE

This application claims priority to Chinese Patent Application No. 201910696085.4, filed Jul. 30, 2019, which is hereby incorporated by reference in its entirety.

FIELD

The present disclosure relates to the field of display, and particularly to an OLED display panel and a method for detecting the OLED display panel, and a display device.

BACKGROUND

For a current large-size organic light-emitting diode (OLED) panel (e.g., an OLED TV), in its peripheral wiring, signal lines of a source-drain metal layer (SD layer) need to be converted to a gate metal layer (Gate layer) and connected with connection terminals of the Gate layer. Specifically, in a partial region of a non-display area adjacent to a display area, when a power supply voltage signal line (VDD) is converted to a wiring structure of the Gate layer (a power supply voltage signal bus, VDD busline), a drive signal line (Data R/G/B/W/Sense line) is still wiring of the SD layer, thus forming a cross-over line.

SUMMARY

The present disclosure discloses an OLED display panel and a method for detecting the OLED display panel, and a display device.

In a first aspect, embodiments of the present disclosure provide an OLED display panel. The OLED display panel includes a base substrate including a display area and a non-display area surrounding the display area and having a first region adjacent to the display area.

The display area includes a plurality of drive signal lines and a plurality of power supply voltage signal lines both extending from the display area to the first region.

The drive signal line includes, in the first region, a first section of wiring at an anode layer, the power supply voltage signal line includes, in the first region, a second section of wiring at a gate metal layer, and parts of the drive signal line and the power supply voltage signal line in the display area are located at a source-drain metal layer.

The gate metal layer, the source-drain metal layer and the anode layer are stacked sequentially on the base substrate.

In some embodiments, in the first region, an orthographic projection of the first section of wiring on the base substrate overlaps an orthographic projection of the second section of wiring on the base substrate.

In some embodiments, the non-display area further includes a second region located on one side of the first region away from the display area.

The second region includes a plurality of connection terminals located at the gate metal layer.

The second section of wiring of the power supply voltage signal line extends into the second region and is connected with a corresponding one of the connection terminals.

The drive signal line includes, in the second region, a third section of wiring located at the gate metal layer which is connected with a corresponding one of the plurality of connection terminals.

In some embodiments, the OLED display panel further includes a first insulating layer disposed between the source-drain metal layer and the anode layer, and a second insulating layer disposed between the gate metal layer and the source-drain metal layer.

The first insulating layer has a first via hole at a first junction between the display area and the first region and a second via hole at a second junction between the first region and the second region. The second insulating layer has a third via hole at the second junction between the first region and the second region.

A part of the drive signal line in the display area is conducted with the first section of wiring through the first via hole, and the first section of wiring is conducted with the third section of wiring through the second via hole and the third via hole.

In some embodiments, the drive signal line further includes a lapping portion located at the source-drain metal layer, and the lapping portion is located between the second via hole and the third via hole for lapping of the first section of wiring and the third section of wiring.

In some embodiments, the second insulating layer has a fourth via hole at the junction between the display area and the first region; and a part of the power supply voltage signal line in the display area is conducted with the second section of wiring through the fourth via hole.

In some embodiments, the drive signal line includes a data signal line and a sensing signal line.

In a second aspect, embodiments of the present disclosure provide a display device, which includes any one of the OLED display panels as described above.

In a third aspect, embodiments of the present disclosure provide a method for detecting any one of the OLED display panels as described above. The method includes forming sequentially a gate metal layer including a plurality of short-circuited gate lines, and a source-drain metal layer; detecting a short circuit defect between signal lines in the source-drain metal layer and the gate lines after forming a pattern of the source-drain metal layer; and disconnecting a short circuit between the gate lines after completing the detecting.

In some embodiments, the detecting the short circuit defect between the signal lines in the source-drain metal layer and the gate lines includes: applying a detection signal to each of the signal lines to inspect whether the short circuit between the signal lines and the gate lines.

DETAILED DESCRIPTION OF THE EMBODIMENTS

The technical solutions of embodiments of the present disclosure will be described clearly and comprehensively with reference to the drawings in the embodiments of the present disclosure. It is apparent that the described embodiments are merely part of the embodiments of the present disclosure rather than all of the embodiments. Based on the embodiments of the present disclosure, all the other embodiments that could be obtained by those skilled in the art without paying creative labor shall fall into the protection scope of the present disclosure.

Figure 1:
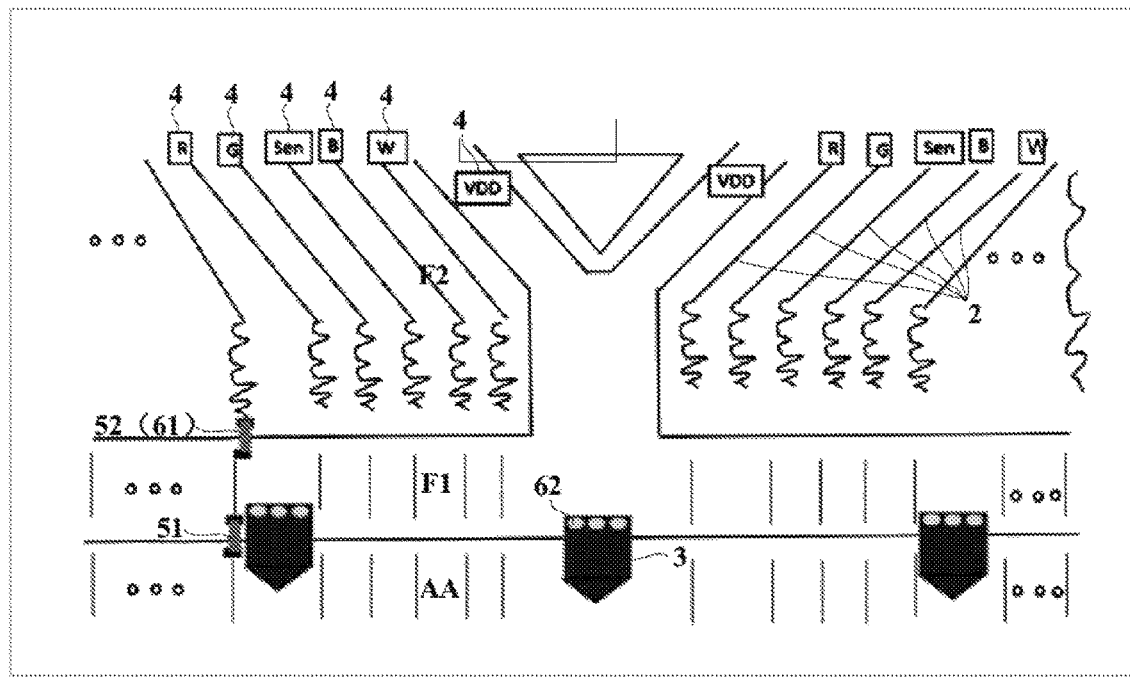
FIG. 1 is a schematic diagram of a partial structure of a display panel according to an embodiment of the present disclosure.
Figure 2:
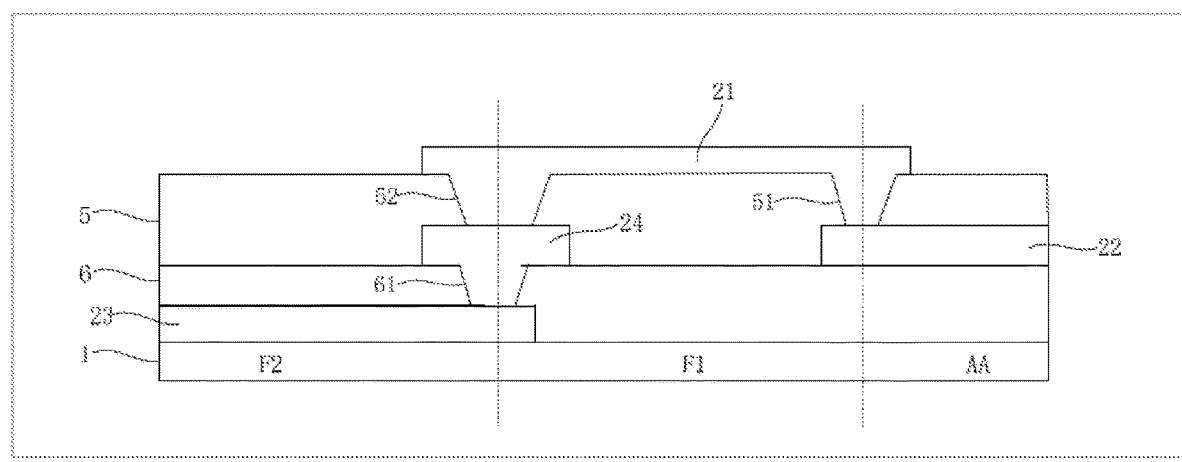
FIG. 2 is a schematic diagram of a partial cross-sectional structure of a display panel according to an embodiment of the present disclosure in an extending direction of a drive signal line.
Figure 3:
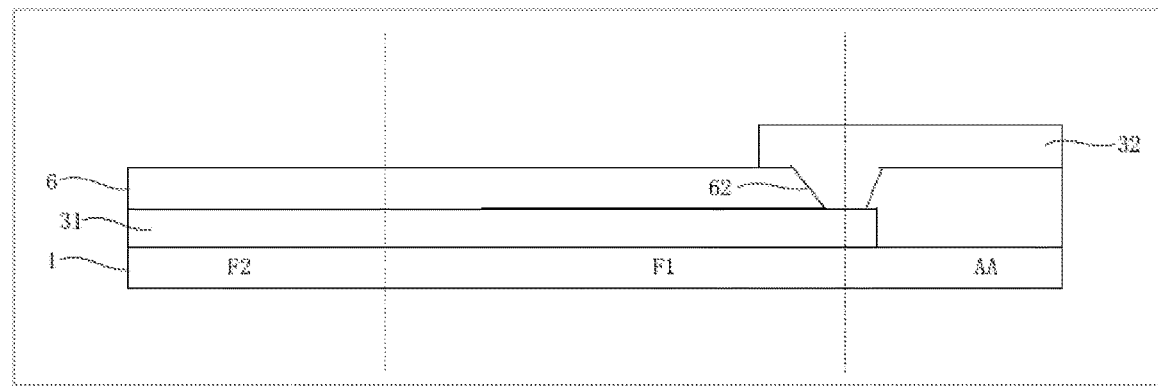
FIG. 3 is a schematic diagram of a partial cross-sectional structure of a display panel according to an embodiment of the present disclosure in an extending direction of a power supply voltage signal line.

As shown in FIGS. 1-3, embodiments of the present disclosure provide an OLED display panel including a base substrate 1 provided with a display area AA and a non-display area surrounding the display area AA. The non-display area includes a first region F1 adjacent to the display area AA.

The display area AA includes a plurality of drive signal lines 2 and a plurality of power supply voltage signal lines 3 both extending from the display area AA to the first region F1.

The drive signal line 2 includes, in the first region F1, a first section of wiring 21 at an anode layer. The power supply voltage signal line includes, in the first region F1, a second section of wiring 31 at a gate metal layer. The parts of the drive signal line 2 and the power supply voltage signal line 3 in the display area AA are located at a source-drain metal layer. The part of the drive signal line 2 in the display area AA is set as a forth section of wiring 22 and the part of the power supply voltage signal line 3 in the display area AA is set as a fifth section of wiring 32.

The gate metal layer, the source-drain metal layer and the anode layer are stacked sequentially on the base substrate 1.

In the above display panel, both the drive signal line 2 and the power supply voltage signal line (VDD) 3 are signal lines extending from the display area AA to the non-display area. In the partial region of the non-display area adjacent to the display area AA (i.e., the first region F1), one section of wiring of the drive signal line 2 (i.e., the first section of wiring 21) is located at the anode layer, and one section of wiring of the power supply voltage signal line 3 (i.e., the second section of wiring 31) is located at the gate layer. The number of layers of insulating films between the two sections of wiring (two layers of wiring) is relatively great (e.g., a first insulating layer 5 and a second insulating layer 6 in FIGS. 2 and 3) and the thickness therebetween is thus relatively great, which can avoid effectively occurrence of a short circuit between the two sections of wiring (two layers of wiring). In other words, a short circuit of the drive signal line 2 and the power supply voltage signal line (VDD) 3 is unlikely to occur in the non-display area and thus the yield rate of display panels can be effectively improved.

In some embodiments, the drive signal line 2 may include a data signal line (e.g., Data R/G B/W line) and a sensing signal line (Data Sense line).

In some embodiments, the anode layer is made of indium tin oxide (ITO). In other words, the first section of wiring 21 of the drive signal line 2 may be made of indium tin oxide (ITO).

In some embodiments, in the first region F1, there may be an overlapping region between orthographic projections of the first section of wiring 21 and the second section of wiring 31 on the base substrate 1.

In some embodiments, the drive signal line 2 and the power supply voltage signal line 3 are both used to connect a source and a drain of a thin film transistor (TFT) in a pixel circuit, and thus the parts of the drive signal line 2 and the power supply voltage signal line 3 in the display area AA (i.e., the fourth section of wiring 22 and the fifth section of wiring 32) are both located at a source-drain metal layer (SD layer).

In some embodiments, as shown in FIGS. 1-3, the non-display area further includes a second region F2 located on one side of the first region F1 away from the display area AA, and further includes connection terminals 4 located at the gate metal layer in the second region.

In some embodiments, the second section of wiring 31 (located at the gate metal layer) of the power supply voltage signal line 3 extends to the second region F2 and is connected with a corresponding one of the connection terminals 4. The drive signal line 2 further includes, in the second region F2, a third section of wiring 23 located at the gate metal layer, and the third section of wiring 23 is connected with a corresponding one of the connection terminals 4.

In some embodiments, in the direction from the display area AA to the periphery of the non-display area, the base substrate 1 includes sequentially the display area AA, the first region F1 and the second region F2. Both the drive signal line 2 and the power supply voltage signal line 3 extend from the display area AA to the connection terminals 4 at the periphery of the non-display area (the second region F2).

The drive signal line 2 includes the fourth section of wiring 22, the first section of wiring 21 and the third section of wiring 23 located at the display area AA, the first region F1 and the second region F2, respectively; the fourth section of wiring 22 is located at the source-drain metal layer, the first section of wiring 21 is located at the anode layer, and the third section of wiring 23 is located at the gate layer and is connected with the connection terminals 4; and the fourth section of wiring 22, the first section of wiring 21 and the third section of wiring 23 are sequentially connected, in other words, the drive signal line 2 is converted sequentially from the source-drain metal layer to the anode layer, then to the gate metal layer, and finally connected with the connection terminals 4 of the gate metal layer.

The power supply voltage signal line 3 includes the fifth section of wiring 32 located at the display area AA, and the second section of wiring 31 located at the first region F1 and the second region F2, the fifth section of wiring 32 is located at the source-drain metal layer, and the second section of wiring 31 is located at the gate metal layer and connected with the connection terminal 4 in the second region F2; and the fifth section of wiring 32 and the second section of wiring 31 are connected end to end, in other words, the power supply voltage signal line 3 is directly converted from the source-drain metal layer to the gate metal layer, which realizes a connection with the connection terminal 4 of the gate metal layer.

In some embodiments, as shown in FIGS. 2 and 3, the OLED display panel provided by the present disclosure further includes a first insulating layer 5 disposed between the source-drain metal layer and the anode layer, and a second insulating layer 6 disposed between the gate metal layer and the source-drain metal layer. For example, the first insulating layer 5 is a passivation layer (PVX), and the second insulating layer 6 is a dielectric layer (ILD) in the TFT.

In some embodiments, the first section of wiring 21 of the drive signal line 2 is located at the anode layer, and the second section of wiring 31 of the power supply voltage signal line 3 is located at the gate metal layer. The two sections of wiring (two layers of wiring) include the first insulating layer 5 and the second insulating layer 6 therebetween and have a relatively great thickness, which can effectively avoid a short circuit between the two sections of wiring (two layers of wiring) and improve the yield rate of display panels.

In some embodiments, as shown in FIGS. 1 and 2, the first insulating layer 5 is provided with a first via hole 51 at the junction between the display area AA and the first region F1 and a second via hole 52 at the junction between the first region F1 and the second region F2, and the second insulating layer 6 is provided with a third via hole 61 at the junction between the first region F1 and the second region F2. In some embodiments, in the drive signal line 2, the fourth section of wiring 22 and the first section of wiring 21 are conducted through the first via hole 51, and the third section of wiring 23 and the first section of wiring 21 are conducted through the second via hole 52 and the third via hole 61.

In some embodiments, as shown in FIGS. 1 and 2, for the same drive signal line 2, the second via hole 52 and the third via hole 61 for connecting the third section of wiring 23 and the first section of wiring 21 of the drive signal line may be overlapped. In other words, projections of the second via hole 52 and the third via hole 61 are at least overlapped, so as to facilitate lapping of the third section of wiring 23 and the first section of wiring 21.

In some embodiments, as shown in FIGS. 1 and 2, the drive signal line 2 may further include a lapping portion 24 located at the source-drain metal layer. The lapping portion 24, located between the second via hole 52 and the third via hole 61, is used for lapping of the third section of wiring 23 and the first section of wiring 21, which can improve the yield rate of connection between the third section of wiring 23 and the first section of wiring 21.

In some embodiments, as shown in FIGS. 1 and 3, the second insulating layer 6 is further provided with a fourth via hole 62 at the junction between the display area AA and the first region F1. In some embodiments, the second section of wiring 31 and the fifth section of wiring 32 of the power supply voltage signal line 3 are conducted through the fourth via hole 62.

In addition, an embodiment of the present disclosure further provides a display device including any one of the OLED display panels as described above.

In some embodiments, the display panel provided by the embodiments of the present disclosure is a large-size OLED display panel. The specific type of the display device provided by embodiments of the present disclosure is not limited, and the display device may be a television (TV), a computer display, a monitor, and the like.

Figure 4:
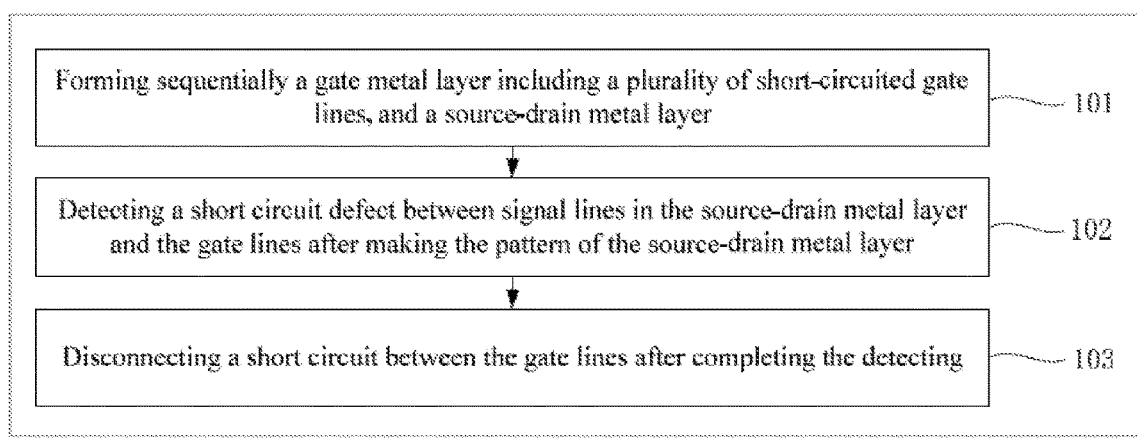
FIG. 4 is a flow chart of a method for preparing a display panel according to an embodiment of the present disclosure.

Based on the OLED display panel provided by embodiments of the present disclosure, an embodiment of the present disclosure further provides a method for detecting an OLED display panel, as shown in FIG. 4. The method includes the following steps.

Step 101: forming sequentially a gate metal layer including a plurality of short-circuited gate lines, and a source-drain metal layer, specifically, e.g., short-circuiting connection terminals of the gate lines at the periphery of the display panel after forming a pattern of the gate metal layer.

Step 102: detecting a short circuit defect between signal lines in the source-drain metal layer (SD layer) and the gate lines after forming the pattern of the source-drain metal layer (i.e., performing a detection of an SD OS stage).

Step 103: disconnecting a short circuit between the gate lines after completing the detecting.

In some embodiments, the signal lines may include a drive signal line, and may include a power supply voltage signal line as well.

In some embodiments, the gate lines are short-circuited, and when a short circuit defect occurs between the signal lines and the gate lines, output signals will change more obviously, so that a detection of the short circuit defect can be improved.

In some embodiments, Step 102, detecting a short circuit defect between signal lines in the source-drain metal layer and the gate lines may specifically include: applying a detection signal to each of the signal lines separately to inspect whether there is a short circuit between each of the signal lines and the gate lines.

In some embodiments, the above method can also be used to detect the Open defect of the signal lines. In addition, it can also be combined with AOI (Automated Optical Inspection) to improve the detection of the Open type defect of the signal lines.

It is apparent that various variations and modifications may be made to the embodiments of the present disclosure by those skilled in the art, without departing from the spirit and scope of the present disclosure. Therefore, the variations and modifications to the present disclosure within the scope of the claims of the present disclosure and their equivalents are to be construed as being included in the disclosure of the present disclosure.

What is claimed is:

1. An organic light-emitting diode (OLED) display panel, comprising:
a base substrate comprising a display area and a non-display area surrounding the display area;
wherein the non-display area comprises a first region adjacent to the display area;
the display area comprises a plurality of drive signal lines and a plurality of power supply voltage signal lines both extending from the display area to the first region;
each of the drive signal lines comprises, in the first region, a first section of wiring at an anode layer, each of the power supply voltage signal lines comprises, in the first region, a second section of wiring at a gate metal layer, and a part, in the display area, of the each drive signal line and a part, in the display area, of the each power supply voltage signal line are located at a source-drain metal layer; and
the gate metal layer, the source-drain metal layer and the anode layer are stacked sequentially on the base substrate;
wherein the non-display area further comprises a second region located on one side of the first region away from the display area;
the second region comprises a plurality of connection terminals located at the gate metal layer;
the second section of wiring of the each power supply voltage signal line extends into the second region and is connected with a corresponding one of the plurality of connection terminals; and
the each drive signal line comprises, in the second region, a third section of wiring located at the gate metal layer, and the third section of wiring of the each drive signal line is connected with a corresponding one of the plurality of connection terminals;

wherein the each power supply voltage signal line further comprises a fifth section of wiring in the display area, the fifth section of wiring is located at the source-drain metal layer, and the fifth section of wiring is directly connected to the second section of wiring.

2. The OLED display panel according to claim 1, wherein in the first region, an orthographic projection of the first section of wiring on the base substrate and an orthographic projection of the second section of wiring on the base substrate has an overlapped region.

3. The OLED display panel according to claim 1, further comprising:
a first insulating layer disposed between the source-drain metal layer and the anode layer; and
a second insulating layer disposed between the gate metal layer and the source-drain metal layer; wherein:
the first insulating layer has a first via hole at a first junction between the display area and the first region and a second via hole at a second junction between the first region and the second region;
the second insulating layer has a third via hole at the second junction between the first region and the second region; a part of the each drive signal line in the display area is conducted with the first section of wiring through the first via hole; and
the first section of wiring is conducted with the third section of wiring through the second via hole and the third via hole.

4. The OLED display panel according to claim 3, wherein the each drive signal line further comprises a lapping portion located at the source-drain metal layer, and the lapping portion is located between the second via hole and the third via hole for lapping of the first section of wiring and the third section of wiring.

5. The OLED display panel according to claim 4, wherein the second insulating layer has a fourth via hole at the first junction between the display area and the first region; and
a part of the each power supply voltage signal line in the display area is conducted with the second section of wiring through the fourth via hole.

6. The OLED display panel according to claim 3, wherein the second insulating layer has a fourth via hole at the first junction between the display area and the first region; and
a part of the each power supply voltage signal line in the display area is conducted with the second section of wiring through the fourth via hole.

7. The OLED display panel according to claim 1, wherein the each drive signal line comprises a data signal line and a sensing signal line.

8. A method for detecting the OLED display panel according to claim 1, comprising:

forming sequentially a gate metal layer comprising a plurality of short-circuited gate lines, and the source-drain metal layer;
detecting a short circuit defect between signal lines in the source-drain metal layer and the gate lines after forming a pattern of the source-drain metal layer; and
disconnecting a short circuit between the gate lines after completing the detecting.

9. The method according to claim 8, wherein the detecting the short circuit defect between the signal lines in the source-drain metal layer and the gate lines comprises:
applying a detection signal to each of the signal lines to inspect whether the short circuit occurs between the signal lines and the gate lines.

10. A display device, comprising an organic light-emitting diode (OLED) display panel, wherein the OLED display panel comprises:
a base substrate comprising a display area and a non-display area surrounding the display area;
wherein the non-display area comprises a first region adjacent to the display area;
the display area comprises a plurality of drive signal lines and a plurality of power supply voltage signal lines both extending from the display area to the first region;
each of the drive signal lines comprises, in the first region, a first section of wiring at an anode layer, each of the power supply voltage signal lines comprises, in the first region, a second section of wiring at a gate metal layer, and a part, in the display area, of the each drive signal line and a part, in the display area, of the each power supply voltage signal line are located at a source-drain metal layer; and
the gate metal layer, the source-drain metal layer and the anode layer are stacked sequentially on the base substrate;
wherein the non-display area further comprises a second region located on one side of the first region away from the display area;
the second region comprises a plurality of connection terminals located at the gate metal layer;
the second section of wiring of the each power supply voltage signal line extends into the second region and is connected with a corresponding one of the plurality of connection terminals; and
the each drive signal line comprises, in the second region, a third section of wiring located at the gate metal layer, and the third section of wiring of the each drive signal line is connected with a corresponding one of the plurality of connection terminals;
wherein the each power supply voltage signal line further comprises a fifth section of wiring in the display area, the fifth section of wiring is located at the source-drain metal layer, and the fifth section of wiring is directly connected to the second section of wiring.

* * * * *